United States Patent
Fredrickson

(10) Patent No.: US 7,123,668 B2
(45) Date of Patent: Oct. 17, 2006

(54) SIMPLE DETECTOR AND METHOD FOR QPSK SYMBOLS

(75) Inventor: Lisa Fredrickson, Long Beach, CA (US)

(73) Assignee: Agere Systems Inc., Allentown, PA (US)

( * ) Notice: Subject to any disclaimer, the term of this patent is extended or adjusted under 35 U.S.C. 154(b) by 687 days.

(21) Appl. No.: 10/251,777

(22) Filed: Sep. 23, 2002

(65) Prior Publication Data

US 2004/0059991 A1 Mar. 25, 2004

(51) Int. Cl.
*H03D 1/00* (2006.01)
*H03M 13/03* (2006.01)
*G06F 11/00* (2006.01)

(52) U.S. Cl. .................. 375/341; 714/766; 714/795; 714/802

(58) Field of Classification Search ............... 375/261, 375/262, 265, 340, 341; 714/758, 766, 767, 714/784, 794–796, 800, 802, 805
See application file for complete search history.

(56) References Cited

U.S. PATENT DOCUMENTS

| | | | |
|---|---|---|---|
| 5,257,272 A | | 10/1993 | Fredrickson |
| 5,781,569 A | * | 7/1998 | Fossorier et al. ............ 714/795 |
| 5,946,329 A | * | 8/1999 | Hirose et al. ................ 714/795 |
| 6,219,387 B1 | * | 4/2001 | Glover ......................... 375/341 |
| 6,522,705 B1 | * | 2/2003 | Conway et al. .............. 375/341 |
| 6,581,184 B1 | * | 6/2003 | Saeki et al. .................. 714/800 |
| 6,741,664 B1 | * | 5/2004 | Cameron ...................... 375/341 |
| 2003/0106011 A1 | * | 6/2003 | Miyauchi et al. ............ 714/780 |

OTHER PUBLICATIONS

Klein et al., PHY Layer Proposal for BWA; IEEE 802.16 Broadband Wireless Access Working Group, Feb. 25, 2000.

* cited by examiner

*Primary Examiner*—Young T. Tse

(57) ABSTRACT

A simplified Viterbi detector for maximum likelihood detection of nine-bit QPSK symbols, employing a difference metric and two comparators, instead of using two state metrics and four comparators. The detector is used to process the outputs of synchronously sampled matched filters. A multiplexer is employed to select the difference metric from amongst the input sample, the fed back value of the difference metric itself, or the inverses of either, depending on decision signals output from the comparators, which in turn compare the difference metric with the input sample and it's inverse. The even path history then represents the most likely value of the detected symbol.

19 Claims, 5 Drawing Sheets ic # SIMPLE DETECTOR AND METHOD FOR QPSK SYMBOLS

BACKGROUND OF THE INVENTION

1. Field of the Invention

The invention relates to a simple demodulator for a proposed wireless standard. More particularly, the invention relates to a simplified detector for nine bit even parity QPSK symbols.

2. Background

The IEEE 802.16 Broadband Wireless Access Working Group has a proposal entitled "PHY layer proposal for BWA," IEEE 802.16.1pc dated Feb. 25, 2000. A required modulation format in this proposal is QPSK (Quadrature Phase Shift Keying). In Section 6.2.2.1.1 of the proposed standard, forward error correction employing a Reed Solomon (RS) code over Galois Field GF(256) is proposed. The RS encoder encodes k user bytes and appends r redundant bytes to form systematic codewords, each consisting of n=k+r bytes. A well-known property of RS codes is an errors-only RS decoder can correct any combination of t erroneous bytes provided that $2t<=r$. It is possible to extend the power of the RS code by utilising a demodulator which marks bytes suspected of being in error with an erasure flag. In this case, an errors-and-erasures RS decoder can correct any combination of t erroneous unflagged bytes and v flagged bytes provided that $2t+v<=r$. Three choices for k and r are proposed, as shown in Table 1.

TABLE 1

| FEC Parameters | | |
| --- | --- | --- |
| Portion | k | r |
| Control and data transport | 128 | 10 |
| Registration | 14 | 6 |
| Contention | 5 | 4 |

In section 6.2.2.1.2 of the proposed standard it is proposed that each eight-bit byte of the RS code is appended with a single parity bit. In a system which uses these parity bits, a total of nine bit symbols are transmitted over the channel for each byte.

QPSK is detected by decomposing the received waveform into I and Q (In-phase and Quadrature) signals, each of which is match-filtered and synchronously sampled. With a perfect estimate of the carrier phase, there is no crosstalk or interference between the signals. The simple threshold detector can be used on each of the sampled outputs of the matched filters.

As a baseline for comparison, the error performance of a system transmitting 8-bit symbols without the parity bits of section 6.2.2.1.2 of the proposed standards can be characterised (before and after errors-only RS decoding) as a function of a Signal-to-Noise Ratio (SNR) of the received signal.

By monitoring the detected bits of the nine bit symbols in a system using the parity bits of section 6.2.2.1.2, an erasure flag can be generated wherever the parity of the detected symbols is incorrect. An errors-and-erasure RS decoder using these flags offers improved performance over the baseline system. This improved performance requires extra complexity in the receiver, since a high throughput errors-and-erasure RS decoder is typically twice the complexity of an errors-only decoder.

It is desirable to have a modulation scheme which achieves similar or better performance without the need for extra complexity in the RS decoder.

SUMMARY OF THE INVENTION

A detector for Quadrature Phase-Shift Keying modulation in accordance with one aspect of the present invention comprises synchronously sampled matched filters, and a Viterbi detector receiving an output from the synchronously sampled matched filters. Outputs of the synchronously sampled matched filters generate samples received by first and second comparators in the Viterbi detector.

A method of detecting symbols from a plurality of samples in accordance with another aspect of the present invention comprises generating an odd decision by comparing a sample with a single metric. An even decision is generated by comparing an inverse of the sample with the single metric. An updated value of the single metric is selected according to the odd decision and the even decision.

In accordance with yet another aspect of the present invention, a Viterbi detector for coded symbols detects a symbol from a sequence of samples. A first comparator has inputs receiving a single metric and a sample, and an output generating an odd decision signal. A second comparator has inputs receiving the single metric and an inverse of the sample, and an output of the second comparator generating an even decision signal. A single metric multiplexer has select inputs receiving the odd decision signal and the even decision signal. The output of the single metric multiplexer generates an updated value of the single metric. An odd path memory has an input receiving the odd decision signal, and an even path memory has a select input receiving the even decision signal. The even path memory stores a detected symbol at the end of each of a plurality of bytes of the samples.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

According to a preferred embodiment of the present invention, a Reed-Solomon code detects by using a difference metric instead of two separate odd and even state metrics, the difference metric corresponding to a difference between the odd and even state metrics. An aspect of the present invention detects a Reed-Solomon code using only two comparators instead of four as in conventional systems. This is performed using a single difference metric instead of two separate odd and even state metrics, with each comparator comparing the difference metric with either an input sample or an inverse of the sample respectively.

In U.S. Pat. No. 5,257,272 "Time Varying Modulo N Trellis Codes for Input Restricted Partial Response Channels," Fredrickson discloses means for improving the error performance of partial response channels utilising a Viterbi detector. The disclosed codes imposed time varying modulo N constraints on the transmitted sequence. The disclosed detector for these codes uses a modified, time-varying Viterbi detector which combines the time-varying modulo N constraints with the constraints imposed by the partial response.

A detector according to the invention is disclosed herein, in which error performance is enhanced on a QPSK channel in which proposed modulation standards impose a modulo 2 constraint. Instead of the standard threshold detector, the synchronously sampled matched filter outputs are applied to a very simple time-varying Viterbi detector. This detector enforces the parity constraint of section 6.2.2.1.2 of the standard and makes a maximum-likelihood decision to find the most likely nine bit transmitted symbol with even parity. A state transition diagram of this detector is shown in FIG. 1.

Figure 1:
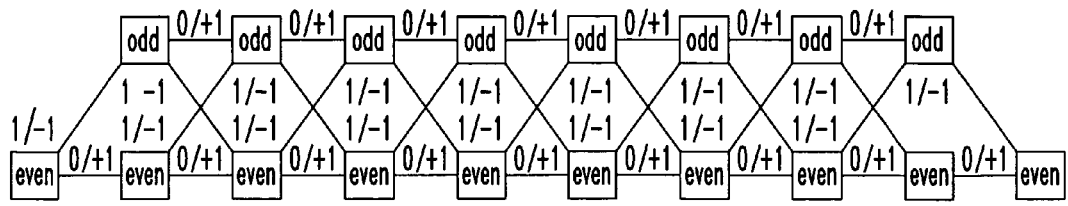
FIG. 1 is a state diagram of a Viterbi detector according to the invention.

It is assumed in FIG. 1 that the normalised output of the matched filter is a +1 for a transmitted 0, and a −1 for a transmitted 1. Time proceeds from left to right in FIG. 1, and each state transition (branch) is labelled with a symbol in the form a/b, where a is the corresponding transmitted bit, and b is the ideal normalised sample at the output of the matched filter. Note that the states in FIG. 1 are labelled odd and even, corresponding to the observed parity of the currently detected subsequences of bits in a detected symbol. The detector is synchronised with symbol boundaries, and imposes the time-varying constraint that the parity is even at the end of every nine bit period.

Detection proceeds using the familiar iterative Viterbi algorithm. In each iteration, a branch metric corresponding to the observed distance between the actual matched filter output and the ideal matched filter output is calculated for each branch connecting state. This branch metric is added to the state metric of the source state, and the result path metrics leading to each state are compared. The comparator selects a path into each state with minimal path metric. This completes the standard add-compare-select (ACS) iteration for each incoming sample. The history of corresponding input bits for each state comparison is kept in a pair of path memories. At the end of nine samples, the past history for the even state contains the most likely nine bit sequence.

At the start of iteration i, denote $M_{odd}^i$ as the state metric of the odd parity state,
$M_{even}^i$ as the state metric of the even parity state,
$B_0^i$ as a branch metric associated with a channel input 0, and
$B_1^i$ as the branch metric associated with a channel input 1, and
$s_i$ as the i th sample of the output of the matched filter.

A suitable branch metric uses the Euclidian distances (or L2 norm)

$$B_0^i=(s_i-1)^2, \text{ and}$$

$$B_1^i=(s_i+1)^2$$

An ACS unit for the odd parity state compares the accumulated path metric $$M_{odd}^i+B_0^i$$

with the path metric $$M_{even}^i+B_1^i.$$

The selection or decision for the odd parity state can be noted using the C-language notation $$d_{odd}^i=(M_{even}^i+B_1^i<=M_{odd}^i+B_0^i)$$

Where the decision, $d_{odd}^i$ is that the most likely input is a 1 if the right-hand side is true, or a 0 if the right-hand side is false. The odd state metric becomes $$M_{odd}^{(i+1)}=d_{odd}^i\{M_{even}^i+B_1^i\}+(1-d_{odd}^i)\{M_{odd}^i+B_0^i\}.$$

The decision for the even parity state is $$d_{even}^i=(M_{odd}^i+B_1^i<=M_{even}^i+B_0^i).$$

and the even state metric becomes $$M_{even}^{(i+1)}=d_{even}^i\{M_{odd}^i+B_1^i\}+(1-d_{odd}^i)\{M_{even}^i+B_0^i\}.$$

The initial decisions at each symbol boundary are biassed to prefer an initial source state with even parity, i.e.

$$d_{even}^{9i}=0 \text{ and } d_{odd}^{9i}=1.$$

If we assume that $M_{even}^0=0$, that all paths initiate from the even parity state, and the accumulated path metrics becomes a sum of branch metrics. Because of this, an arbitrary positive scaling factor c can be introduced, so that the modified branch metrics $$B_0^i=c(s_i-1)^2, \text{ and}$$

$$B_1^i=c(s_i+1)^2$$

perform equally well.

When the detector symbol is correct, the accumulated metric $$M_{even}^9 = c\sum_{i=0}^{8} n_i^2,$$

where $n_i$ is the i th noise component of the output of the matched filter, and is a scaled sum of noise power observed over the last symbol interval.

In a preferred embodiment the detector can be made with less complexity and higher throughput.

Consider the branch metric $$B_0^i=(s_i-1)^2/4=(s_i^2-2s_i+1)/4, \text{ and}$$

$$B_1^i=(s_i+1)^2/4=(s_i^2+2s_i+1)/4.$$

The comparators have common terms on both sides of the equation, so equivalent comparisons are given by $$d_{odd}^i=(M_{even}^i+(s_i/2)<=M_{odd}^i-(s_i/2)), \text{ and}$$

$$d_{even}^i=(M_{odd}^i+(s_i/2)<=M_{even}^i-(s_i/2)).$$

These decisions can be re-expressed as $$d_{odd}^i=(s_i<=M_{odd}^i-M_{even}^i), \text{ and}$$

$$d_{even}^i=(M_{odd}^i-M_{even}^i<=-s_i).$$

Denote the difference metric as $$M_{diff}^i=M_{odd}^i-M_{even}^i.$$

Figure 2:
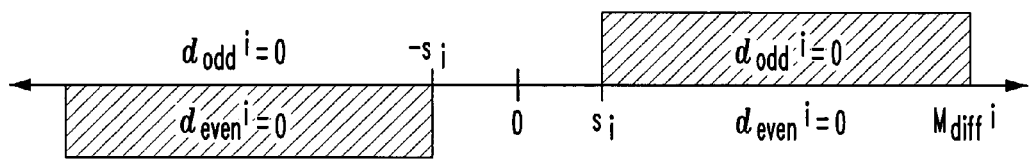
FIG. 2 shows decision regions where $s_i$ is greater or equal to 0.
Figure 3:
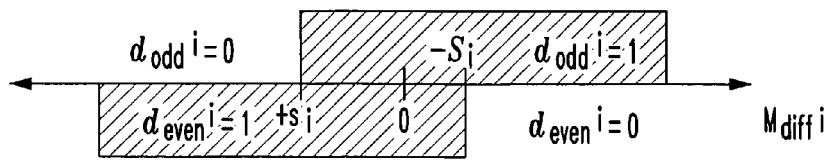
FIG. 3 shows decision regions where $s_i$ is less than 0.

The decision space can be viewed pictorially as shown in FIGS. 2 and 3.

The x-axis denotes the value of the difference metric at time i. The decision regions for $d_{odd}^i$ are indicated above the x-axis, while the decision reasons for $d_{even}^i$ are indicated below the x-axis. FIG. 2 shows the decision regions where $s_i \leq 0$, while FIG. 3 shows the cases where $s_i < 0$.

These decisions can be made using two comparators. To update the difference metric, consider the following cases.

Case 1. Suppose $d_{odd}^i = d_{even}^i = 0$. Then $$M_{odd}^{(i+1)} = M_{odd}^i - (s_i/2),$$

$$M_{even}^{(i+1)} = M_{even}^i - (s_i/2), \text{ and}$$

$$M_{diff}^{(i+1)} = M_{diff}^i.$$

Case 2. Suppose $d_{odd}^i = d_{even}^i = 1$. Then $$M_{odd}^{(i+1)} M_{even}^i + (s_i/2),$$

$$M_{even}^{(i+1)} = M_{odd}^i + (s_i/2), \text{ and}$$

$$M_{diff}^{(i+1)} = M_{diff}^i.$$

Case 3. Suppose $d_{odd}^i = 1$ and $d_{even}^i = 0$. Then $$M_{odd}^{(i+1)} = M_{even}^i + (s_i/2),$$

$$M_{even}^{(i+1)} = M_{even}^i - (s_i/2), \text{ and}$$

$$M_{diff}^{(i+1)} = s_i.$$

Note that this case occurs at initialisation at each symbol boundary, and this forced decision at time 9i alleviates the need to initialise $M_{diff}^{9i}$.

Case 4. Suppose $d_{odd}^i = 0$ and $d_{even}^i = 1$. Then $$M_{odd}^{(i+1)} = M_{odd}^i - (s_i/2),$$

$$M_{even}^{(i+1)} = M_{odd}^i + (s_i/2), \text{ and}$$

$$M_{diff}^{(i+1)} = -s_i.$$

As can be seen from these cases, the decisions can be used as the selection input of a four way multiplexer, whose input is the updated difference metric, $M_{diff}^{(i+1)}$. Two inverters are needed to supply the additional inverses of $M_{diff}^i$ and $s_i$ as inputs to the multiplexer.

Figure 7:
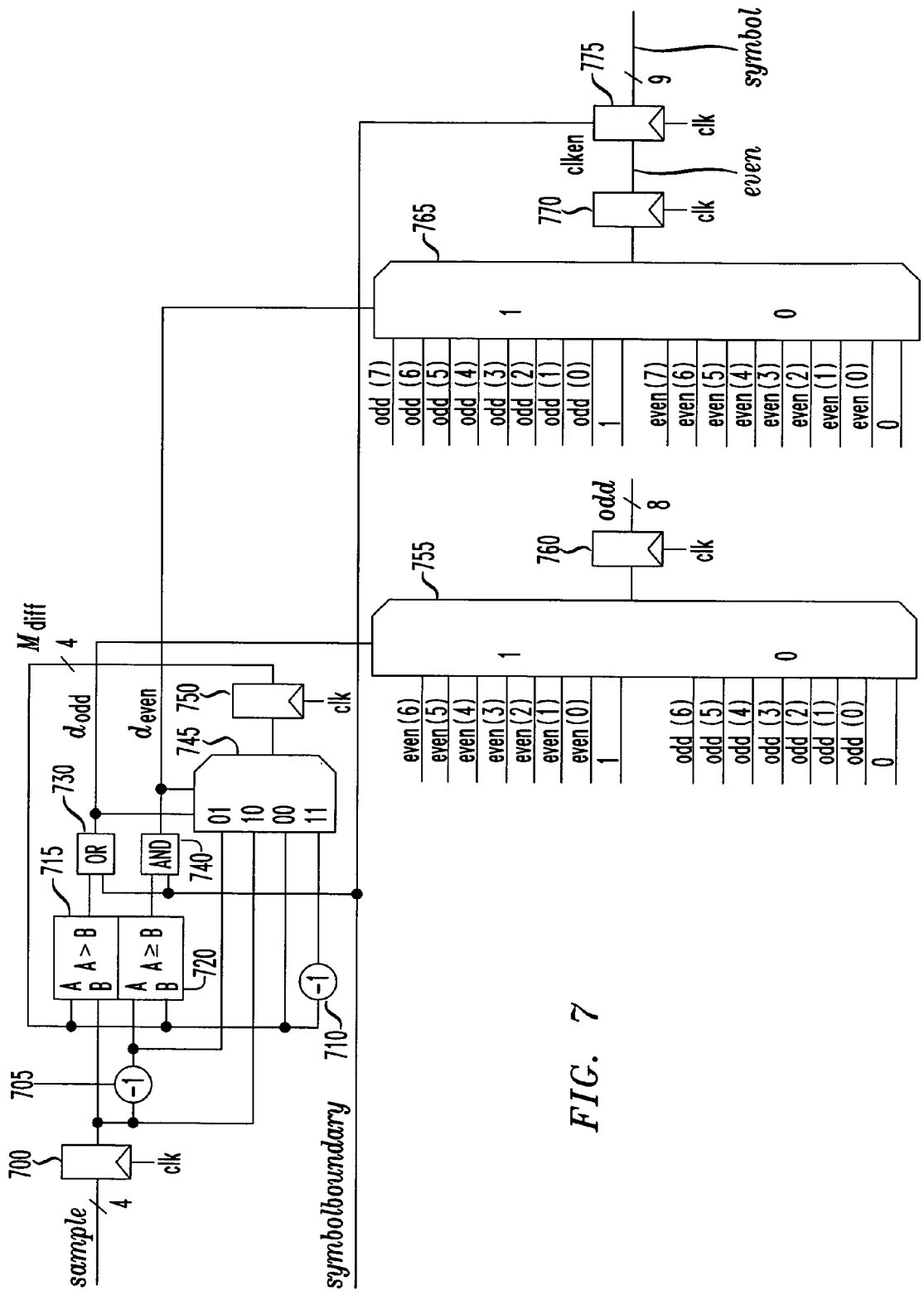
FIG. 7 is a block diagram of a detector according to the invention.

A preferred embodiment of a detector circuit is shown in FIG. 7. The circuit includes a sample register 700, inverters 705 and 710, comparators 715 and 720, an OR gate 730, an AND gate 740, an $M_{diff}$ multiplexer 745, an $M_{diff}$ register 750, an odd path memory including multiplexer 755 and register 760, and an even path memory including multiplexer 765 and register 770, and an output register 775.

The signals that enter the demodulator are a sample signal including four bit samples inputted to sample register 700 and a symbol boundary indicator denoted symbolboundary. The symbolboundary signal is 1 when sample 9i is in the sample register 700, and 0 otherwise. This symbolboundary signal sets $d_{odd} = 1$, $d_{even} = 0$, loads the previously detected nine bit symbol into the output register 775 with output symbol, and initializes $M_{diff}$ to take on the value in the sample register 700.

For the remaining eight bits to be detected, the comparators 715 and 720 make the decisions $d_{odd}$ and $d_{even}$, which in turn are employed as select inputs on the $M_{diff}$ multiplexer 745 to take on one of four values as desired.

The two path histories are implemented as register exchange path memories, as they are known in the art. The path memory output for the odd parity state is labeled odd, whilst the path memory output for the even state is labeled even. Note that the path memory for the odd parity state only needs to be 8 bits wide, whilst the path memory for the even parity state contains 9 bits. The multiplexers 755 and 765 perform the exchanges, using the decisions $d_{odd}$ and $d_{even}$ as select inputs.

Note that a traditional two-state Viterbi detector would maintain two separate state metrics, using four path metric adders, two comparators, and two 2-way multiplexers to make decisions and update state metrics. The critical path would propagate through an adder, a comparator and a selector.

By comparison, the detector disclosed in the preferred embodiment maintains a single difference metric, uses two inverters 705 and 710, two comparators 715 and 720 and one 4-way multiplexer 745 to make decisions and to update the difference metric. A critical path propagates through an inverter, a comparator, a gate and multiplexer logic, and involves less delay. This is a faster and smaller implementation than the traditional two-state Viterbi detector.

If desired, a more complex detector can issue additional information about the decoded symbol by using a traditional Viterbi detector and also outputting the accumulated path metric observed during symbol detection. This path metric can be compared to a threshold, for example, to generate erasure flags for an errors-and-erasures RS decoder. It can also be used to provide a local estimate of the noise power observed over the last nine bit symbol, and this information can be accumulated to provide the overall system feedback on the current operating conditions.

Figure 4:
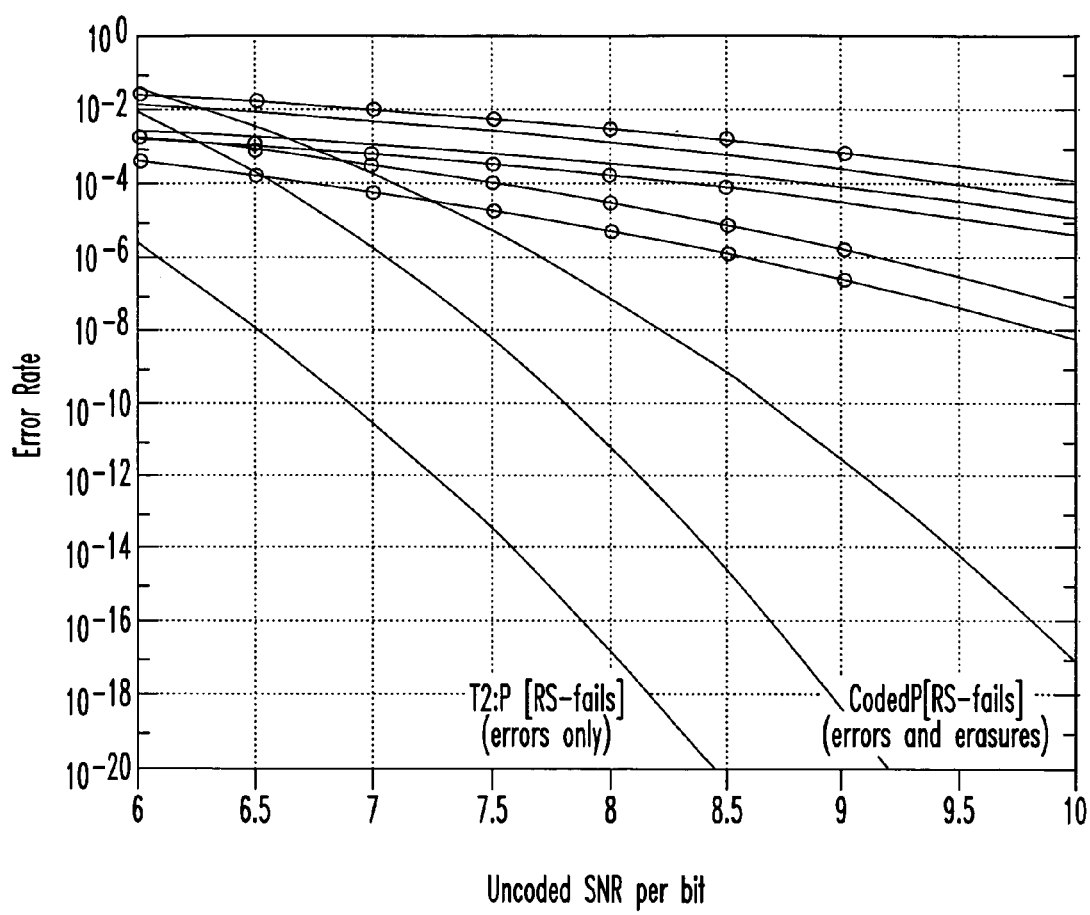
FIG. 4 is a graph of error rate versus Signal-to-Noise Ratio for a Reed Solomon code where k=128 and r=10.

FIG. 4 shows that a comparison made between error performance of a baseline system using no parity and an errors-only RS decoder (denoted uncoded), a system using the parity and an errors-and-erasures RS decoder (denoted coded), and a system using the disclosed detector and an errors-only RS decoder (denoted T2). In each case, the RS code has parameters k=128, r=10. FIG. 4 plots various error rates as a function of uncoded Signal-to-Noise Ratio (SNR). The solid lines in FIG. 4 are theoretical curves, while the circles in FIG. 4 were obtained by performing bit-by-bit simulations. The uncoded Signal-to-Noise Ratio (SNR) is defined as $$SNR_{uncoded} = 10.0 \log_{10}(1/(2F^2)),$$

where F is the standard deviation of white, Gaussian noise which was added to the ideal output of the matched filter. To fairly compare this coded systems using the parity bits, the transmitted coded signal per bit is reduced by 0.51 dB to account for the rate loss of the 8/9 parity code.

The curve labeled UncodedP [bit-error] in FIG. 4 is the probability of threshold-detected bit-error without the parity check bits. The curve labeled CodedP [bit-error] is the probability of threshold-detected bit error when the signal energy per bit is reduced by 0.51 dB.

Similarly, the curve labeled UncodedP [byte-error] in FIG. 4 is the probability of threshold detected byte error without the parity check bits. When utilizing the parity check code for erasure flag generation, most of the erroneous bits are properly flagged. The curve labeled CodedP [byte-erase] is the probability of threshold detected byte flagging when the transmitted signal energy per coded bit is reduced by 0.51 dB. The curve labeled CodedP [byte-error] is the probability of threshold detected byte errors which do not violate the parity constraint, when the transmitted signal energy per coded bit is reduced by 0.51 dB. The curve denoted T2:P [byte-error] is the probability of Viterbi detected byte errors using the disclosed detector, when the transmitted signal energy per bit is reduced by 0.51 dB.

The outputs of these demodulators are then fed to RS decoders. The curve labeled UncodedP [RS-fails] is the probability in the RS errors-only detector fails, using the output bytes of the threshold-detector with no parity code. The curve labeled CodedP [RS-fails] is the probability that the RS errors-and-erasures detector fails, using the output bytes of the threshold detector with the erasures flags generated by detecting parity violations. The curve labeled T2:P [RS-fails] is the probability that the RS errors-only detector fails, using the output bytes of the disclosed Viterbi detector.

Figure 5:
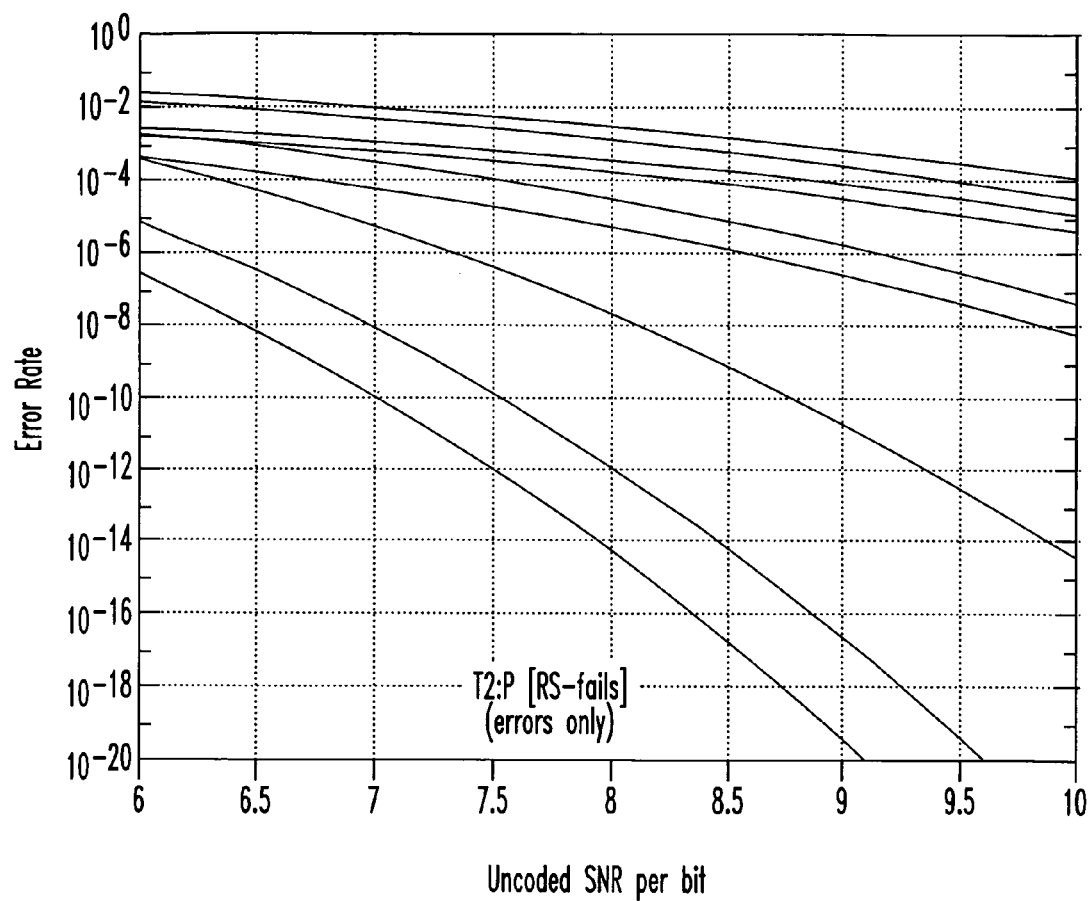
FIG. 5 is a graph of error rate versus Signal-to-Noise Ratio for a Reed Solomon code where k=14 and r=6.
Figure 6:
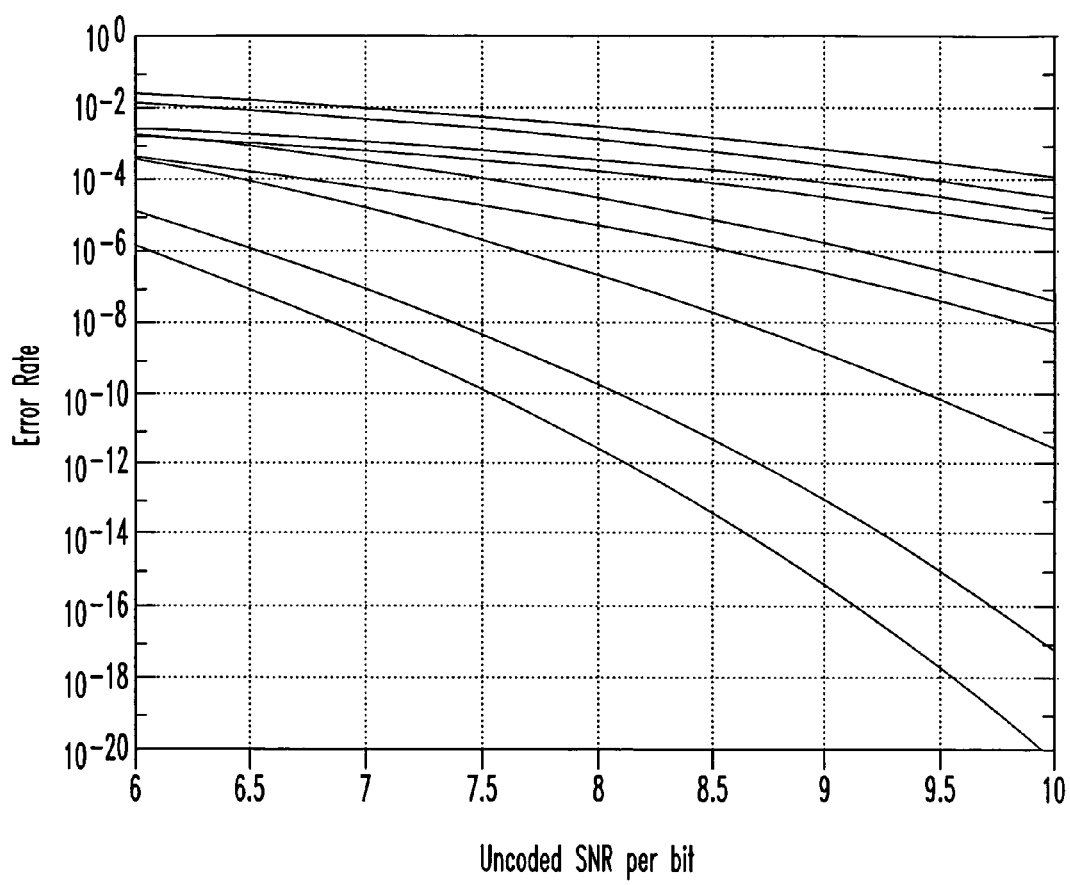
FIG. 6 is a graph of error rate versus Signal-to-Noise Ratio for a Reed Solomon code where k=5 and r=4.

As can be observed from FIG. 4, the disclosed Viterbi detector outperforms the other techniques using the simplest RS decoder. FIGS. 5 and 6 show similar results for the other proposed RS parameters. In FIG. 5, the RS code members has parameters k=14, r=6, while in FIG. 6 k=5, r=4.

In conclusion, a simple Viterbi detector can be used to enhance the error performance of one of the favoured proposals within the 802.16.1 proposed standard. The detector described in relation to the preferred embodiment achieves good performance with the use of the simpler errors-only RS decoder, and outperforms parity detection schemes using a more complex errors-and-erasures RS decoder.

While the invention has been described with reference to the exemplary embodiments thereof, those skilled in the art will be able to make various modifications to the described embodiments of the invention without departing from the true spirit and scope of the invention.

What is claimed is:

1. A detector for Quadrature Phase-Shift Keying modulation, comprising:
   a Viterbi detector receiving outputs from synchronously sampled matched filters;
   wherein first and second comparators in said Viterbi detector receive samples generated by outputs of said synchronously sampled matched filters;
   an updated single metric being selected by a single metric multiplexer in said Viterbi detector from a group consisting of:
   a sample;
   an inverse of said sample;
   a single metric; and
   an inverse of said single metric;
   wherein an output of each of said first and second comparators is used as select inputs to said single metric multiplexer to select said updated single metric.

2. The detector for Quadrature Phase-Shift Keying modulation according to claim 1, further comprising:
   means for setting an odd decision signal to a first logic state when a last bit in each byte is read; and
   means for setting an even decision signal to a second logic state different from said first logic state when said last bit in each byte is read.

3. The detector for Quadrature Phase-Shift Keying modulation according to claim 1, wherein:
   said single metric is a difference metric representing a difference between an odd state metric and an even state metric.

4. The detector for Quadrature Phase-Shift Keying modulation according to claim 3, further comprising:
   register exchange memories adaptively coupled to said first and second comparators and forming odd and even path memories.

5. A method of detecting symbols from a plurality of samples, comprising:
   generating an odd decision by comparing a sample with a single metric;
   generating an even decision by comparing an inverse of said sample with said single metric; and
   selecting an updated value of said single metric according to said odd decision and said even decision;
   wherein said updated value of said single metric is selected from a group consisting of:
   said single metric;
   an inverse of said single metric;
   said sample; and
   aid inverse of said sample.

6. The method of detecting symbols from the plurality of samples according to claim 5, further comprising:
   repeating said generating an odd decision step and said generating an even decision step for each of said plurality of samples until one byte of said plurality of samples has been read; and
   storing an odd path history and an even path history comprising successive values of samples for said odd decision and said even decision, respectively;
   wherein said even path history represents one of said detected symbols.

7. The method of detecting symbols from the plurality of samples according to claim 6, wherein:
   said method of detecting symbols is repeated for each byte of said plurality of samples.

8. The method of detecting symbols from the plurality of samples according to claim 7, further comprising:
   when a last bit in each byte is read, setting said odd decision signal to a first logic state, and setting said even decision signal to a second logic state different from said first logic state.

9. The method of detecting symbols from the plurality of samples according to claim 8, wherein:
   said single metric is a difference metric representing a difference between an odd state metric and an even state metric.

10. The method of detecting symbols from the plurality of samples according to claim 9, wherein:
    each said detected symbol comprises nine bits with even parity.

11. The method of detecting symbols from the plurality of samples according to claim 7, further comprising:
    synchronously sampling a Quadrature Phase-Shift Keying modulated signal, thereby generating said plurality of samples.

12. The method of detecting symbols from the plurality of samples according to claim 11, further comprising:
    when a last bit in each said byte is read, setting said odd decision to a first logic state, and setting said even decision to a second logic state different from said first logic state.

13. The method of detecting symbols from the plurality of samples according to claim 12, wherein:
    said single metric is a difference metric representing a difference between an odd state metric and an even state metric.

14. The method of detecting symbols from the plurality of samples according to claim 13, wherein:
    each said detected symbol comprises nine bits with even parity.

15. A Viterbi detector for coded symbols, to detect a symbol from a sequence of samples, comprising:
- a first comparator, inputs of said first comparator receiving a single metric and a sample, an output of said first comparator generating an odd decision signal;
- a second comparator, inputs of said second comparator receiving said single metric and an inverse of said sample, an output of said second comparator generating an even decision signal;
- a single metric multiplexer, select inputs of said single metric multiplexer receiving said odd decision signal and said even decision signal, said output of said single metric multiplexer generating an updated value of said single metric;
- an odd path memory, a select input of said odd path memory receiving said odd decision signal; and
- an even path memory, a select input of said even path memory receiving said even decision signal;
- wherein said even path memory stores a detected symbol at an end of each of a plurality of bytes of said samples;
- wherein said updated value of single metric is selected by said single metric multiplexer from a group consisting of:
- said sample;
- said inverse of said sample;
- said single metric; and
- an inverse of said single metric.

16. The Viterbi detector for coded symbols, to detect a symbol from a sequence of samples according to claim 15, further comprising:
- means for setting said odd decision signal to a first logic state when a last bit in each byte is read; and
- means for setting said even decision signal to a second logic state different from said first logic state when said last bit in each byte is read.

17. The Viterbi detector for coded symbols, to detect a symbol from a sequence of samples according to claim 16, wherein:
- said single metric is a difference metric representing a difference between an odd state metric and an even state metric.

18. The Viterbi detector for coded symbols, to detect a symbol from a sequence of samples according to claim 17, wherein:
- said odd and even path memories are register exchange memories.

19. The Viterbi detector for coded symbols, to detect a symbol from a sequence of samples according to claim 18, wherein:
- each said detected symbol comprises nine bits with even parity.

* * * * *